US011041900B2

(12) United States Patent
Weimer

(10) Patent No.: US 11,041,900 B2
(45) Date of Patent: Jun. 22, 2021

(54) EQUI-RESISTANT PROBE DISTRIBUTION FOR HIGH-ACCURACY VOLTAGE MEASUREMENTS AT THE WAFER LEVEL

(71) Applicant: Teradyne, Inc., North Reading, MA (US)

(72) Inventor: Jack E. Weimer, Gurnee, IL (US)

(73) Assignee: Teradyne, Inc., North Reading, MA (US)

( * ) Notice: Subject to any disclaimer, the term of this patent is extended or adjusted under 35 U.S.C. 154(b) by 1038 days.

(21) Appl. No.: 14/225,918

(22) Filed: Mar. 26, 2014

(65) Prior Publication Data

US 2015/0276803 A1 Oct. 1, 2015

(51) Int. Cl.
*G01R 1/04* (2006.01)
*G01R 31/26* (2020.01)

(52) U.S. Cl.
CPC ...... *G01R 31/2621* (2013.01); *G01R 31/2608* (2013.01)

(58) Field of Classification Search
CPC ............ G01R 31/2896; G01R 31/2844; G01R 1/07385; G01R 1/36; G01R 31/2889; G01R 3/00
See application file for complete search history.

(56) References Cited

U.S. PATENT DOCUMENTS

| 4,016,483 | A | | 4/1977 | Rudin |
| 4,147,971 | A | * | 4/1979 | Price .................. H01L 23/5258 257/E23.15 |
| 4,175,253 | A | | 11/1979 | Pitegoff |
| 4,176,313 | A | | 11/1979 | Wrinn |

(Continued)

FOREIGN PATENT DOCUMENTS

| CN | 104459272 A | 3/2015 |
| JP | S60-142526 A | 7/1985 |

(Continued)

OTHER PUBLICATIONS

International Search Report and Written Opinion of the International Searching Authority from International Application No. PCT/US2015/021206, dated Jun. 30, 2015, 10 pages.

(Continued)

*Primary Examiner* — Son T Le
*Assistant Examiner* — Adam S Clarke
(74) *Attorney, Agent, or Firm* — Wolf, Greenfield & Sacks, P.C.

(57) ABSTRACT

A test system and test techniques for accurate high-current parametric testing of semiconductor devices. In operation, the test system supplies a current to the semiconductor device and measures a voltage on the device. The testing system may use the measured voltage to compute an ON resistance for the high-current semiconductor device. In one technique, multiple force needles contact a pad in positions that provide equi-resistant paths to one or more sense needles contacting the same pad. In another technique, current flow through the force needles is regulated such that voltage at the pad of the device under test is representative of the ON resistance of the device and independent of contact resistance of the force needle. Another technique entails generating an alarm indication when the contact resistance of a force needle exceeds a threshold.

25 Claims, 7 Drawing Sheets

(56) References Cited

U.S. PATENT DOCUMENTS

| | | | |
|---|---|---|---|
| 4,178,543 A | 12/1979 | Wrinn et al. | |
| 4,179,652 A | 12/1979 | Davis | |
| 5,767,693 A * | 6/1998 | Verkuil | G01R 29/24 |
| | | | 250/492.2 |
| 5,844,421 A * | 12/1998 | Lee | G01R 3/00 |
| | | | 324/750.24 |
| 6,218,846 B1 * | 4/2001 | Ludwig | G01R 1/07342 |
| | | | 324/713 |
| 6,452,436 B1 | 9/2002 | Leip | |
| 6,556,034 B1 | 4/2003 | Johnson et al. | |
| 6,820,028 B2 * | 11/2004 | Ye | G01D 9/005 |
| | | | 156/345.13 |
| 6,972,576 B1 | 12/2005 | Lyons et al. | |
| 8,762,095 B2 | 6/2014 | Van Wagenen et al. | |
| 2002/0084795 A1 | 7/2002 | Cook et al. | |
| 2004/0041581 A1 | 3/2004 | Saijyo et al. | |
| 2004/0124829 A1 | 7/2004 | Swettlen et al. | |
| 2005/0258835 A1 | 11/2005 | Saijyo et al. | |
| 2006/0152234 A1 * | 7/2006 | Miller | G01R 31/31905 |
| | | | 324/750.3 |
| 2010/0164519 A1 * | 7/2010 | Sellathamby | G01R 1/07385 |
| | | | 324/756.03 |
| 2010/0213963 A1 | 8/2010 | Yoshikawa | |
| 2010/0244880 A1 * | 9/2010 | Urabe | G01R 31/31924 |
| | | | 324/762.01 |
| 2011/0285416 A1 | 11/2011 | Petersen | |
| 2012/0235697 A1 * | 9/2012 | Jang | G01R 1/06722 |
| | | | 324/754.03 |
| 2014/0029150 A1 | 1/2014 | Fledell et al. | |
| 2015/0070039 A1 | 3/2015 | Shimura | |
| 2015/0267699 A1 | 9/2015 | Pippes et al. | |
| 2015/0276799 A1 | 10/2015 | Weimer | |

FOREIGN PATENT DOCUMENTS

| | | |
|---|---|---|
| JP | 07-245401 A | 9/1995 |
| JP | 2001-041999 A | 2/2001 |
| JP | 2009-538428 A | 11/2009 |
| JP | 2015-055550 A | 3/2015 |
| WO | WO 2007/137284 A2 | 11/2007 |

OTHER PUBLICATIONS

International Preliminary Report on Patentability for International Application No. PCT/US2015/021206 dated Oct. 6, 2016.

International Search Report and Written Opinion for International Application No. PCT/US2015/021203 dated Jun. 30, 2015.

International Preliminary Report on Patentability for International Application No. PCT/US2015/021203 dated Oct. 6, 2016.

Chinese Office Action for Application No. 201580014717.4 dated Jun. 5, 2019.

Japanese Communication for Application No. JP 2016-557293 dated Mar. 25, 2019.

Chinese Office Action for Chinese Application No. 201580014874.5 dated Jun. 6, 2019.

* cited by examiner

EQUI-RESISTANT PROBE DISTRIBUTION FOR HIGH-ACCURACY VOLTAGE MEASUREMENTS AT THE WAFER LEVEL

BACKGROUND

Automatic test equipment (referred to generally as a "tester") is used to test semiconductor devices during their manufacture. Functional testing is typically performed by applying electrical signals to a device under test (DUT) and measuring the output response of the DUT at certain points.

Parametric testing may also be performed. In parametric testing, one or more voltages or currents may be measured to provide a value for an operating parameter of the DUT. For example, for testing a power transistor, the test system may apply a test signal that turns on the transistor. The tester may then measure a voltage across the device and current flow through it, from which the ON resistance of the transistor may be computed. For an engineer designing a product with a power transistor, ON resistance may be an important parameter, because of its impact on heat dissipation and power consumption of the device. Thus, when semiconductor devices that are or include power transistors are tested, parametric tests may include a measurement of ON resistance.

In some scenarios, devices are tested at the wafer level. Testing at the wafer-level has several benefits including testing and validating a device before it is diced and packaged. A wafer contains many devices. Each device contains conducting structures, which may serve as contact points at which test signals may be applied to or measured to a DUT on a wafer. A tester interfaces with the device using probe cards which contains multiple probe needles. These tiny needles are used to make electrical contact between the pads of the individual devices and the tester. In order to make electrical contact, a wafer prober presses the wafer against the probe needles so that the needle tips make physical contact with the device. Once the probe needles have made contact with the pads, the testing process can begin.

In some scenarios, the DUTs may be high-current devices such as power MOSFETs. However, each needle on the probe card may have a maximum current capacity. In order to test high-current devices such as power MOSFETs, multiple probe needles may be used to deliver the desired test current. As the technology to manufacture power MOSFETs has advanced, their ON resistance has been reduced to, in some cases, 1 milliohm and below.

SUMMARY

In one aspect, the invention relates to a method of testing a semiconductor device. The method of testing a semiconductor device may comprise contacting a pad of the semiconductor device with a plurality of probe needles. The plurality of probe needles may comprise a plurality of first needles and at least one second needle. The plurality of needles may comprise tips, where the tips of the plurality of first needles are positioned so as to provide equi-resistant paths between tips of the first needles to a nearest tip of a needle of the at least one second needle. The method of testing a semiconductor device may also comprise providing current through the plurality of first needles. The method of testing a semiconductor device may also comprise measuring voltage at the at least one second needle.

In another aspect, the invention may relate to a probe card for testing a semiconductor device. The semiconductor device may comprise a MOSFET with a pad. The probe card may also comprise a plurality of needles comprising tips positioned to contact the pad. The plurality of needles may comprise a plurality of force needles and at least one sense needle. The plurality of force needles may be positioned with tips that are equi-distant from a nearest tip of a sense needle of the at least one sense needle.

In yet another aspect, the invention may relate to a test system for testing a semiconductor device. The semiconductor device may comprise a pad. The test system may comprise a probe card. The probe card may comprise a plurality of needles comprising tips positioned to contact the pad. The plurality of needles may comprise a plurality of first needles and at least one second needle. The plurality of first needles may be positioned with tips that are equi-distant from a nearest tip of a needle of the at least one second needle. The test system may also comprise at least one current source coupled to the plurality of first needles. The test system may also comprise at least one voltage sense circuit coupled to the at least one second needle.

The foregoing is a non-limiting summary of the invention, which is defined only by the appended claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

Figure 1:
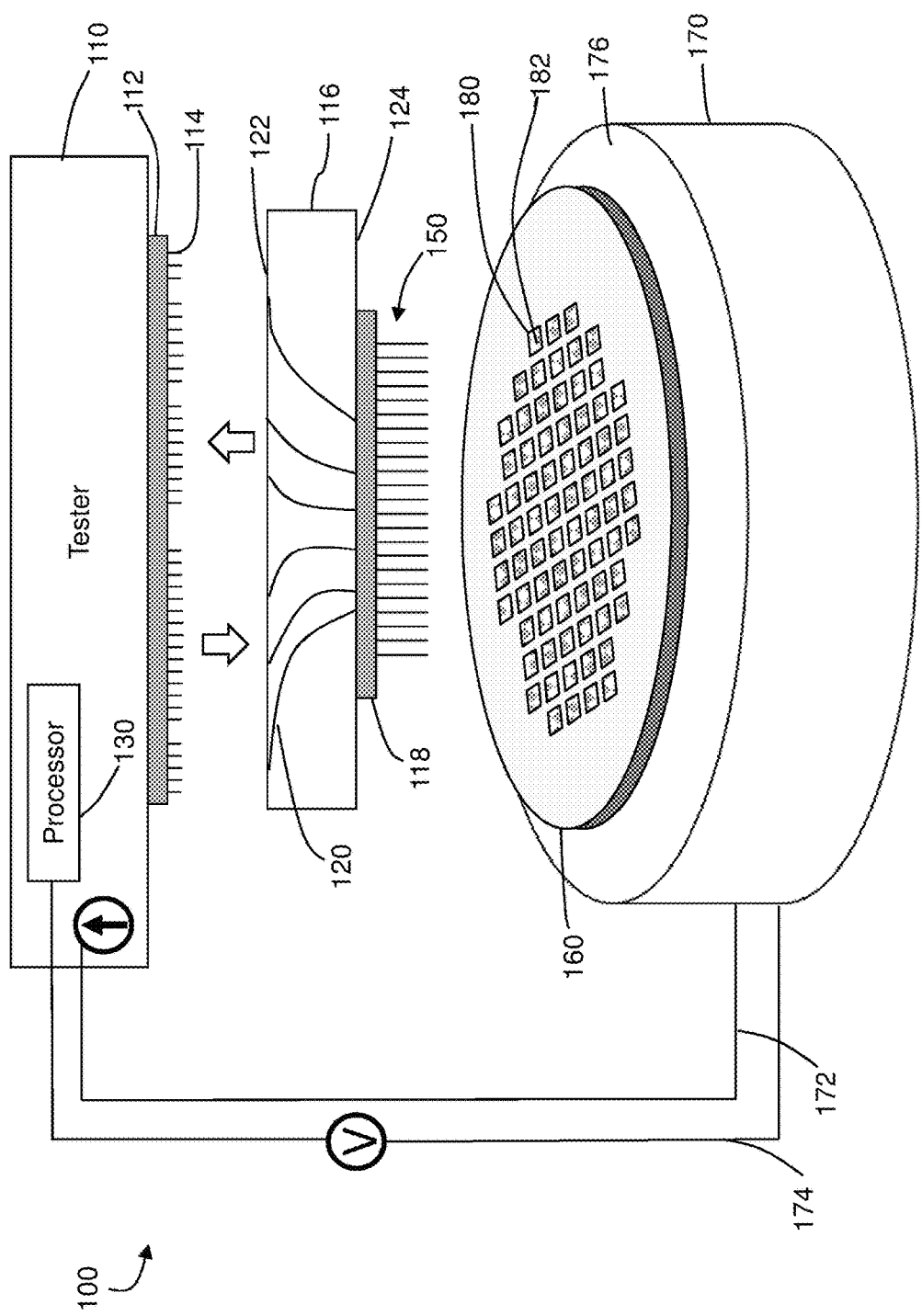
FIG. 1 is a schematic illustration of a test system configured for wafer-level testing of a DUT.

The foregoing is a non-limiting summary of the invention, which is defined by the attached claims.

DETAILED DESCRIPTION

The inventors have recognized and appreciated that appropriate placement of multiple probe needles intended to contact the same conducting structure of a device under test may impact measurement accuracy for parametric measurements. In modern semiconductor devices, a conducting structure of a device under test (DUT), such as the source pad in a FET, may have a non-negligible resistance. In a test scenario in which power to a DUT is supplied with at least two different probe needles and voltage is measured at that pad with at least one other probe needle, the resistance through the pad between the location at which power is supplied and voltage is measured may impact the accuracy of the parametric measurement.

The inventors have recognized and appreciated that probe needles placed to reduce differences in resistance along the paths from the locations where power is supplied to locations where voltage is measured may increase measurement accuracy of voltages. Further, the inventors have recognized and appreciated that measurement of ON resistance may be particularly susceptible to variations in measured voltage attributable to such differences in resistance, such that appropriate probe needle placement may increase the accuracy of ON resistance measurements, particularly for high-current devices, such as power MOSFETs. The impact on measurement accuracy may be particularly significant where there are variations in contact resistance for the multiple probe needles through which current is supplied.

Accordingly, described herein are improved techniques for making parametric measurements that can lead to more accurate voltage measurements on high-current devices on semiconductor wafers. A test system using these techniques may make accurate ON resistance measurements for semiconductor devices, such as power MOSFETs or devices containing power MOSFETs. Measurement techniques as described herein may be applied to devices with low ON resistance, such as 1 milliohm or less. These techniques may also be applied to high-current devices, such as devices in which the ON current exceeds 10 A.

In some embodiments, these techniques may entail appropriately positioning probe needles intended to contact a pad of a device under test. The probe needles may be positioned to reduce variation in overall measurements that may be caused by variation in resistance between multiple probe needles that contact a pad. When a current is supplied through a pad of a DUT and a voltage is measured at that pad, probe needles through which the supplied current will flow, referred to herein as force needles, and those through which the voltage is to be measured, referred to herein as sense needles, may be distributed so as to provide equi-resistance paths between force needles and a respective nearest sense needle.

While not being bound by any particular theory of operation, the inventor believes that having multiple force needles and one or more sense needles at which voltage is measured creates a resistive summing network that averages the voltages at different locations where force needles contact the pad. The averaging compensates for variations in contact resistance, leading to a more accurate measurement. However, variations in the resistance between the force and sense needles reduce the accuracy of the summed voltage because variations in the resistance of the paths impact the amount that a voltage at a force needle contributes to the summed voltage, which may depend on the resistance between the force needle and sense needle. By positioning force and sense needles to reduce this variation in resistance, a source of variation in the measurements is reduced, increasing accuracy of the overall process.

Equi-resistance paths between force needles and a respective nearest sense needle may be achieved in any suitable way. In some embodiments, the pad may have a uniform distributed resistance. Therefore, in embodiments in which there are multiple force needles and one sense needle per pad, equi-resistant paths may be created by separating the contact points of the force needles and the sense needle by equi-distant paths. Accordingly, tips of the force needles may be arrayed along an arc of a circle centered around the tip of the sense needle. Though, other suitable geometries may provide equi-distant paths. Where multiple sense needles are used, the sense needles may be clustered together such that the tips of the force needles are clustered around the tips of the sense needles. Alternatively or additionally, tips of multiple sense needles may be distributed across the pad and the tips of the force needles may be positioned equi-distant from a nearest sense needle tip. Such a configuration may provide paths that suitably approximate equi-resistant paths.

According to some embodiments, more accurate parametric measurements may be achieved using a test system. The test system may include hardware and circuitry that enable parametric testing of devices at the wafer level. The device under test may be a high-current device. Herein, a power MOSFET is used as an example of a high-current device. The test system may perform parametric testing of an ON resistance.

The test system may include a component that brings a tester into contact with the DUT to perform the parametric measurements. Contact between the tester and the MOSFET may be made in any suitable way. For example, a wafer prober may be used to press the wafer of DUTs against a probe card, attached to the tester, so that the force and sense needles contact a DUT. The wafer prober may include a chuck that holds the wafer.

Once the needles have made contact with a conductive pad, such as a source pad, of the MOSFET, the tester can begin the testing process. The tester, which may be implemented using any suitable conventional test circuitry, may have circuitry that supplies a current or voltage to turn the MOSFET or other DUT on. Other circuitry may supply a current that flows through the device while the device is on. In some embodiments, for example, the tester includes a current source, coupled to the force needles, which is used to supply current in excess of 10 A. In some embodiments, each of the force and sense needles may be manufactured to have a high current capacity, such as up to 7 A. The current may flow through any suitable path through the test system. For example, the tester may be connected to the chuck in the wafer prober such that the current may flow through the chuck, through the drain of the MOSFET, through the force needles and through the tester circuitry.

The tester may then measure various properties of the MOSFET, such as the source to drain voltage. In some embodiments, the tester contains voltage sensing circuitry, coupled to a sense needle, to sense the voltage between the point where the sense needles make contact to the source pad and the drain of the MOSFET while the MOSFET is turned on. In some embodiments, the drain of the MOSFET is electrically connected to the chuck carrying the wafer such that measuring the voltage between probe needles, contacting the source pad, and the chuck yields a measurement of the drain to source voltage of the MOSFET. Any suitable voltage sensing circuitry may be used. In other embodiments, the tester contains voltage sensing circuitry coupled to more than one sense needle. In this case, the voltage sensing circuitry measures a composite voltage between a node that the sense needles are connected to and the chuck. The sense needles may be connected to this node in any suitable way. For example, the sense needles may be connected to the node through equal-value resistors.

In order to compute an ON resistance, in some embodiments, the tester may include a processor coupled to the voltage sense circuit that computes the ON resistance based on the current supplied to the MOSFET and the measured voltage between the source pad and the drain. After the ON resistance is computed, the measurement may be used for any purpose. For example, the computed ON resistance may be used to select a subsequent step or steps in the manufacturing process, such as dicing the wafer and packaging the device or discarding the device, if the ON resistance does not meet specifications.

The test system may include a probe card, which may have needles positioned as described above to reduce variation in overall measurements that may be caused by variation in resistance between the multiple needles that contact the test pad. The probe card may have force needles and one or more sense needles positioned to create equi-resistant paths when those needles contact a pad of a DUT. In some embodiments, the force needles and one sense needle may be positioned on the probe card so that the force needle tips are arrayed along an arc of a circle centered around the tip of the sense needle. This geometry creates equi-distant paths from the center sense needle tip to the tips of each force needle. Though, any suitable geometry of force and sense needles on the probe card that creates equi-distant paths may be used.

In other embodiments, the probe card may have multiple force and multiple sense needles. In this case, the sense needles may be clustered together such that the tips of the force needles are clustered around the tips of the sense needles on the probe card. Alternatively or additionally, the tips of multiple sense needles may be distributed across the probe card and the tips of the force needles may be positioned equi-distant from a nearest sense needle tip on the probe card. The sense needles may be connected together to create a measurement node at which the sensed voltage is measured. The connections among the sense needles may be in the probe card, in the tester or in interface circuitry joining the probe card to the tester. This positioning of the force and sense needles on the probe card may likewise provide equi-resistant paths between the force needle and a nearest sense needle to reduce the variations in contact resistance and improve the accuracy of the overall testing process.

It should be appreciated that a test system for performing accurate parametric measurements may be implemented using any suitable test hardware configured for wafer-level testing.

A specific example of such a test system is illustrated in FIG. 1. However, it should be appreciated that the test system of FIG. 1 is for illustration and not a limitation on the scope of the invention.

FIG. 1 illustrates a wafer-level test system 100 that includes a tester 110 that may generate and measure test signals, including current and voltage signals for parametric measurements. In this example, tester 110 may provide electrical signals to a DUT 180 and sense signals at the DUT 180. Tester 110 may be implemented using any suitable conventional test circuitry.

Electrical connections between tester 110 and DUT 180 may be made through any suitable interface components. In the embodiment of FIG. 1, a probe card 118 with multiple probe needles 150 is coupled to the test system. The probe needles 150 are positioned to make contact with conductive structures on a DUT. Probe card 118 may be configured to test a specific DUT, and different probe cards may be used for different DUTs. Accordingly probe card 118 may be removably attached to tester 110. Attachment mechanisms are known in the art and are not shown for simplicity.

To couple signals between a tester 110 and probe card 118, one or more interface components may be used. In the embodiment illustrated, a device interface board (DIB) 116 is shown. DIB 116 may have contacts on a lower surface 124, positioned to connect to corresponding contacts on probe card 118. An upper surface 122 of DIB 116 may also contain pads. The pads on the upper surface may be positioned to align with contacts 114 on tester interface 112. Internal to DIB 116, conductive traces 120 may couple the pads on the upper surface to the pads on the lower surface 124.

Circuitry within tester 110 that generates or measures test signals may be coupled to contacts 114. In this way, signals may pass between tester 110 and DIB 116 and then between DIB 116 and probe card 118. In this way, signals may pass between tester 110 and the needles designed to contact DUT 180. In some embodiments, the path between tester 110 and probe needles 150 may be passive. In other embodiments, circuitry may be included in the path to manage signal conditions and/or to perform test functions that tester 110 is not equipped to handle. Test functions described herein may be performed by circuitry within tester 110, in some embodiments, while in other embodiments, those functions may be performed by circuitry on DIB 116 or located in any other suitable component.

DUT 180 may be or include a high-current device, which in this example is a power MOSFET. There may be an array of DUTs on a wafer 160, and one or more of the DUTs may be concurrently tested. The DUTs may share a common drain connection on the wafer 160. In the embodiment illustrated, the common drain is electrically connected to the lower surface of the wafer.

Wafer 160 may be held to a chuck 170 using a vacuum or other suitable mechanism. The upper surface of chuck 170 may be highly polished or otherwise configured to make a very low resistance electrical connection to the wafer 160 and the common drain of the DUTs. In some embodiments, chuck 170 may have a gold-plated surface 176 for receiving the wafer 160.

The tester 110 may make contact with the DUT 180 in any suitable way. In FIG. 1, mechanical components (not shown) within the wafer prober press the wafer 160 into the probe needles 150 to make physical contact. As the needles make contact with the DUTs, the needles may scrub a surface 182 of the DUT 180 to break through any surface layer, such as surface oxidation, and make an electrical contact with the surface of the DUT. The surface may be a conducting structure of the DUT, such as a source pad 182 of the MOSFET. Contact may be made to other surfaces for other purposes. For example, one or more probe needles may make contact to a gate pad of the MOSFET to supply a voltage to bias on the MOSFET. Accordingly, the number and purpose of test connections is not critical to the invention.

The tester 110 may have circuitry that supplies a test signal to turn the DUT 180 on. For simplicity, such a test signal is not expressly shown, but such a test signal may be generated using techniques as are known in the art. Additionally, tester 110 may have circuitry that generates a current of a magnitude equal to an operating current of a high-current device. In FIG. 1, a current source 172 is used to supply current to the DUT 180 in excess of 10 A. Such a current, for example, may be up to 40 A, 50 A, 60 A, 70 A or more, in some embodiments.

Each of the probe needles 150 may be manufactured to have a high-current capacity, such as up to 7 A. The current capacity of each needle, though, may be less than the total current needed to test DUT 180. Accordingly, in some embodiments, the total current may be divided among multiple force needles that contact the same pad of DUT 180. The current may flow through any suitable path through the test system. In FIG. 1, for example, the current may flow through the chuck 170, through the DUT 180, through the needles 150 and through the tester circuitry.

The tester 110 may then measure various parameters of the DUT 180. For measuring ON resistance, a drain to source voltage of the power MOSFET may be measured. That voltage may be measured as the source pad to chuck voltage 174. Any suitable voltage sensing circuitry may be used to make this measurement.

In order to compute an ON resistance, in some embodiments, the tester may include or be coupled to a processor 130 that computes the ON resistance based on the current supplied to the DUT 180 and the sensed voltage 174. After the ON resistance is computed, the measurement may be used for any purpose. For example, the computed ON resistance may be used to select a subsequent step or steps in the manufacturing process, such as dicing the wafer and packaging the device or discarding the device.

Figure 2:
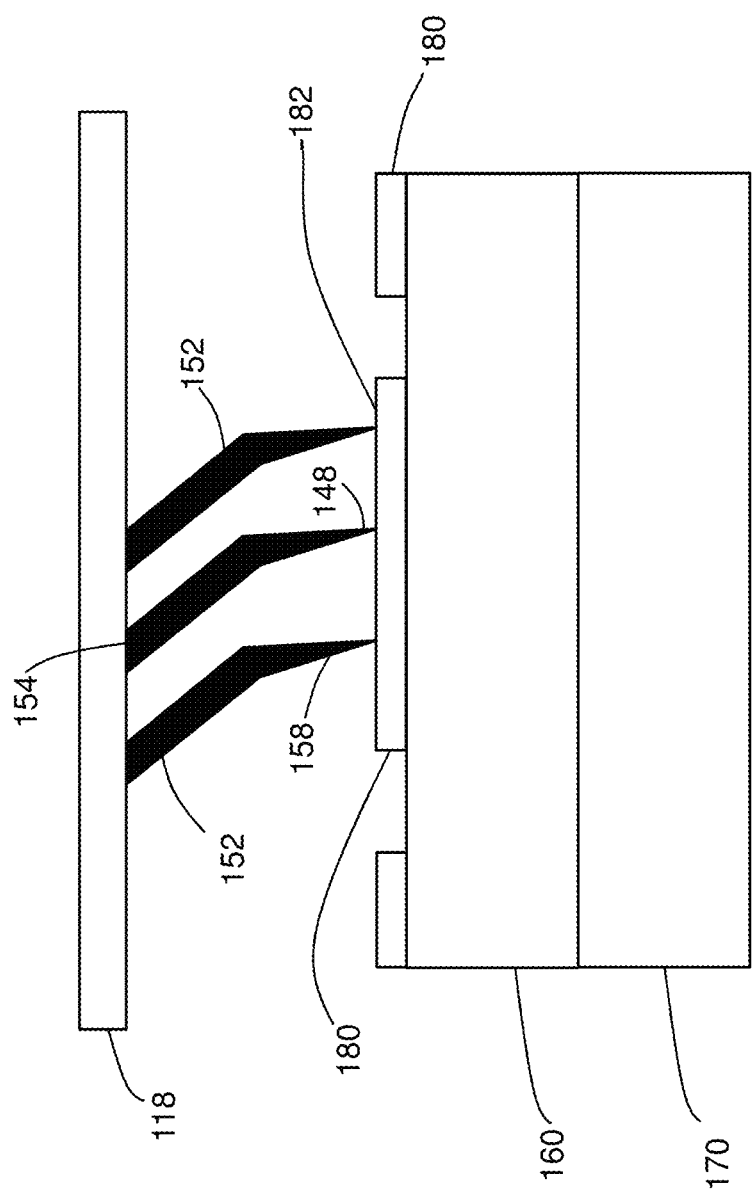
FIG. 2 is a schematic, profile view of a probe card and probe needles contacting a pad of a semiconductor device according to a first embodiment of wafer-level testing of a DUT.

FIG. 2 illustrates a probe card 118 and probe needles. The probe needles 150 may include force needles 152 and one or more sense needles 154. The force needles may be connected, directly or indirectly, to circuitry within the test system that provides a current. The sense needles may be connected, directly or indirectly, to circuitry within the test system that measures a parameter. In the embodiment illustrated, that parameter is a voltage. In the testing of a power MOSFET, that voltage represents the voltage at a source pad of the MOSFET. In embodiments in which the DUT is or includes a vertical power MOSFET, the drain of the MOSFET may be coupled to chuck 170 (FIG. 1) such that measurement of the source pad voltage with respect to the voltage of chuck 170 represents a drain to source voltage measurement of the power MOSFET. Likewise, a current source coupled to force needles may be coupled to the chuck 170 to complete a path for current flow between source and drain of the power MOSFET. These connections 172 and 174 (FIG. 1) are not shown in FIG. 2 for simplicity.

The force needles may have tips 158. The sense needles may have tips 148. The probe needle tips 158 and 148 may make physical and electrical contact with the surface of the DUT 180. The surface of the DUT may have a source pad 182. The force needle tips 158 may be positioned about the one or more sense needle tips 148 in a way that increases the accuracy of a measured voltage, according to techniques as described herein.

Figure 3:
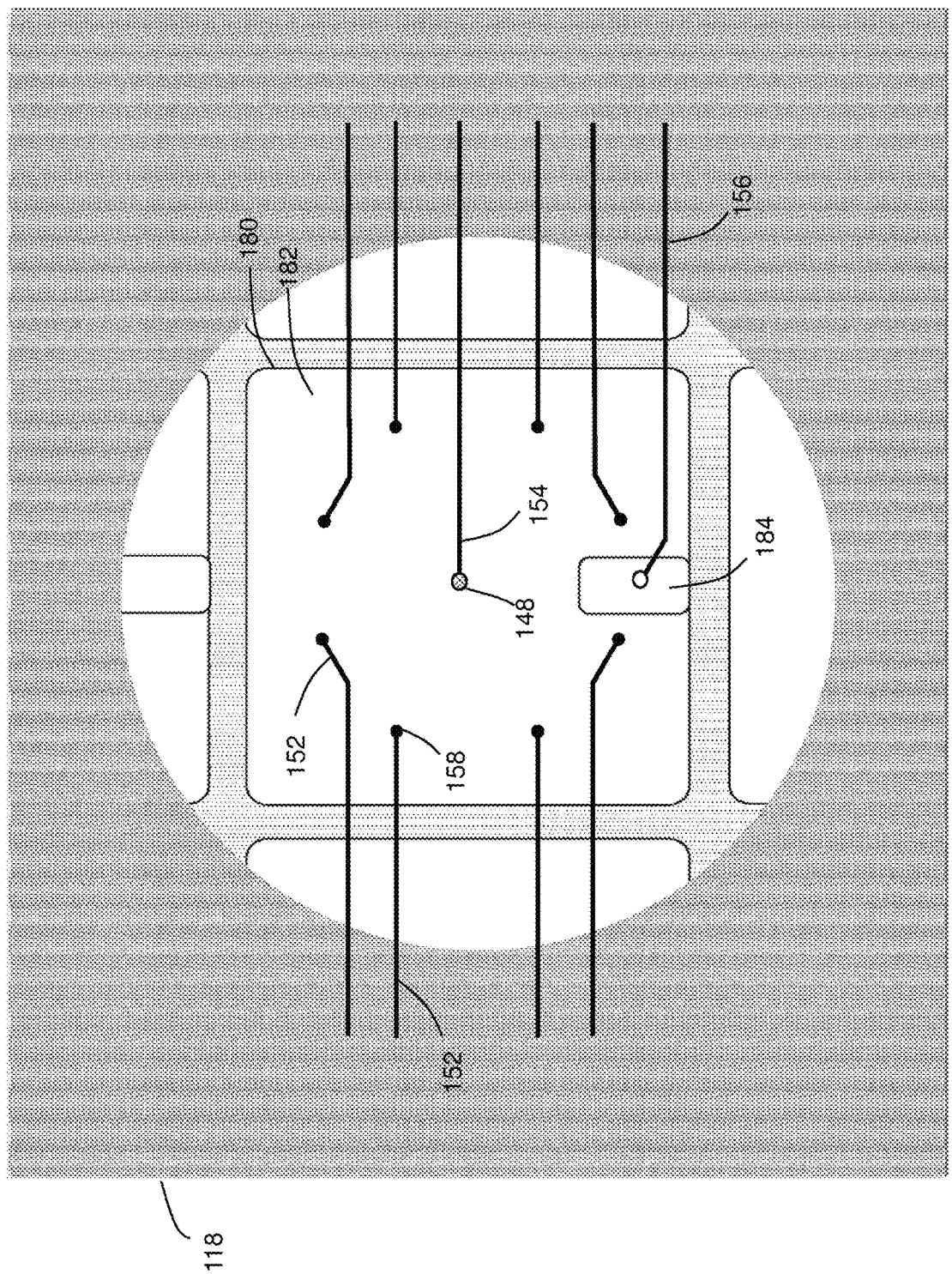
FIG. 3 is a schematic illustration of the top view of a DUT on a wafer and probe needles contacting a pad of the DUT according to a first embodiment of wafer-level testing of a DUT.

A technique for increasing the accuracy of the measured voltage via selective probe needle placement is illustrated in FIG. 3, which is a top view of a source pad 182 of a DUT 180. FIG. 3 illustrates a probe card 118 and probe needles 150. The probe card 118 has force needles 152 and a sense needle 154 positioned to create equi-resistant paths between the force needles 152 and the sense needle 154. FIG. 3 illustrates a scenario in which the resistance of the source pad 182 has uniform resistance such that equi-resistant paths can be created by separating the tips of the force needles and the sense needle by equal distances. In such an embodiment, for example, the force needles 152 and sense needle 154 may be positioned on the probe card so that the force needle tips 158 are arrayed along an arc of a circle centered around the tip of the sense needle 148. This geometry creates equi-distant paths from the center sense needle tip 148 to the tips of each force needle 158. In other embodiments, any geometry of force and sense needles on the probe card may be used that creates equi-distant paths.

In the embodiment of FIG. 3, the force needles 152 may be coupled to current generation circuitry in a tester. That circuitry may be configured to generate a high current appropriate for testing a high-current device, such as a power MOSFET. Sense needle 154 may be coupled to a voltage sense component of the test system. Gate pad 184 may be contacted by yet another probe needle 156. Probe needle 156 may be connected to circuitry within the test system that generates a bias voltage for DUT 180 to place it in the on state for measuring ON resistance. In this embodiment, probe needle 156 represents a connection that may be made to DUT 180 to place it in condition for a parametric test to be performed. It should be appreciated that, depending on the nature of the device or the nature of the tests to be performed, other connections may alternatively or additionally be made to DUT 180.

FIG. 3 illustrates one example of needle positioning that may yield equi-resistant paths. In that embodiment, a single sense needle per source pad is used. In other embodiments, multiple sense needles may contact a pad where a voltage is to be measured. In such an embodiment, the probe needles may nonetheless be positioned to provide equi-resistant paths between the force needle tips and a node at which the multiple sense needles are connected such that a voltage measurement may be made at that node. An embodiment with multiple sense needles is illustrated in FIG. 4.

Figure 4:
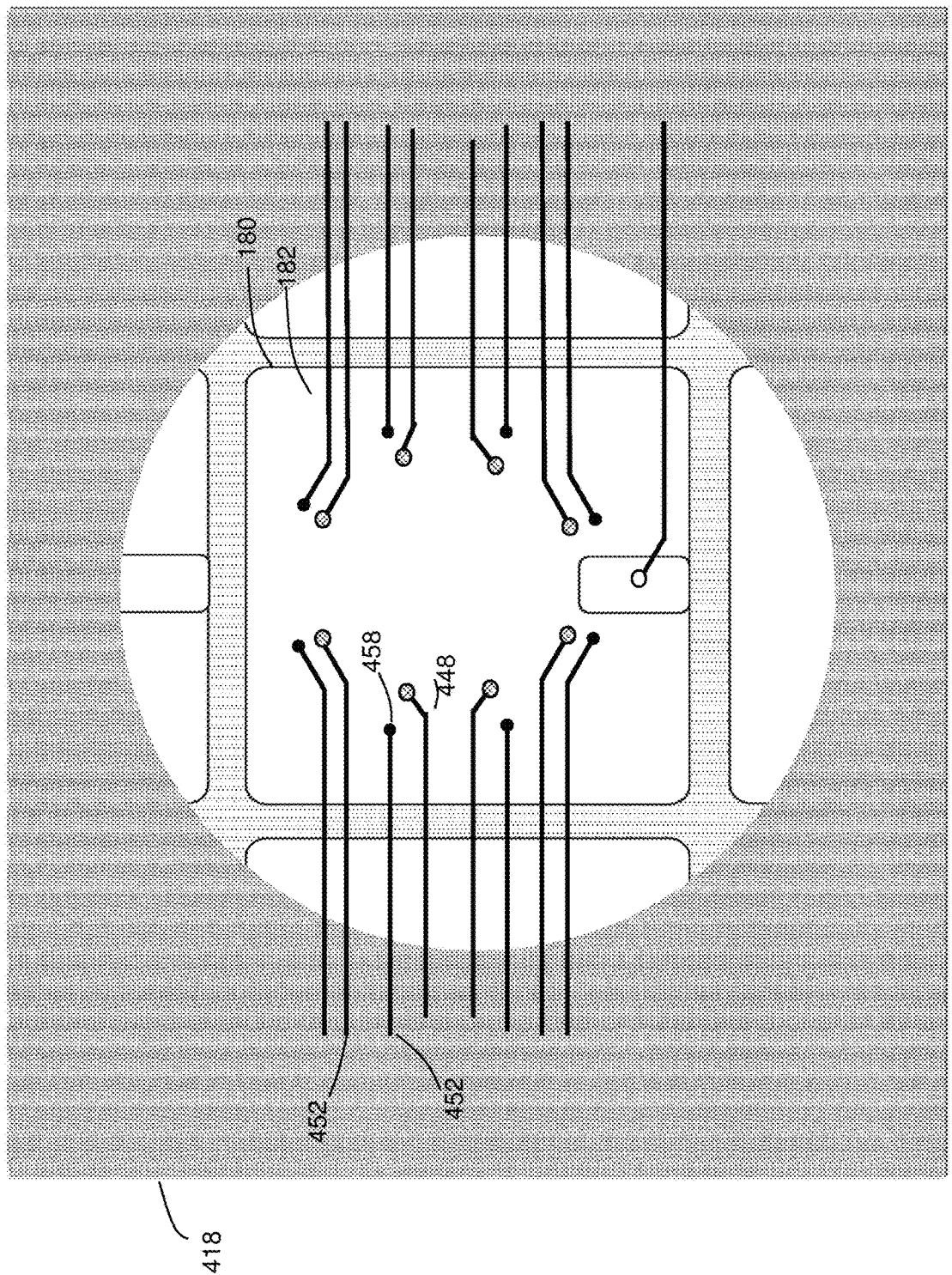
FIG. 4 is a schematic illustration of the top view of a DUT on a wafer and probe needles contacting a pad of the DUT according to a second embodiment of wafer-level testing of a DUT.

FIG. 4 illustrates a probe card 418 and probe needles 150. The probe card 418 may have multiple force needles 452 and multiple sense needles 454. In this case, the tips of multiple sense needles 448 may be distributed across the source pad 482 and the tips of the force needles 458 may be positioned equi-distant from an adjacent sense needle tip 448 on the source pad 482. In some embodiments, the tips of the sense needles 448 may be symmetrically distributed, such as with the sense needles each on a ray from the center of a circle to a force needle, as in the embodiment illustrated. Alternatively or additionally, the sense needles 454 may be clustered together such that the tips of the force needles 458 are clustered around the tips of the sense needles 448 on the source pad 182. When the sense needles are connected at a node, such a configuration approximates equi-resistant paths between the force needles and the node to which the sense needles are connected.

As with the embodiment of FIG. 3, DUT 180 may be biased on for an ON resistance measurement. A bias signal may be provided through probe needle 156. The force needles may be coupled to a circuit that supplies a regulated amount of current through the needles. The regulated amount through each force needle may, in the aggregate, equal the current through the DUT at which the ON resistance is to be measured. The sense needles may be connected together and then coupled to measurement circuitry within the tester. Such a connection may be made, for example within the probe card, within a DIB or in any other suitable way, such as within a tester.

Figure 5:
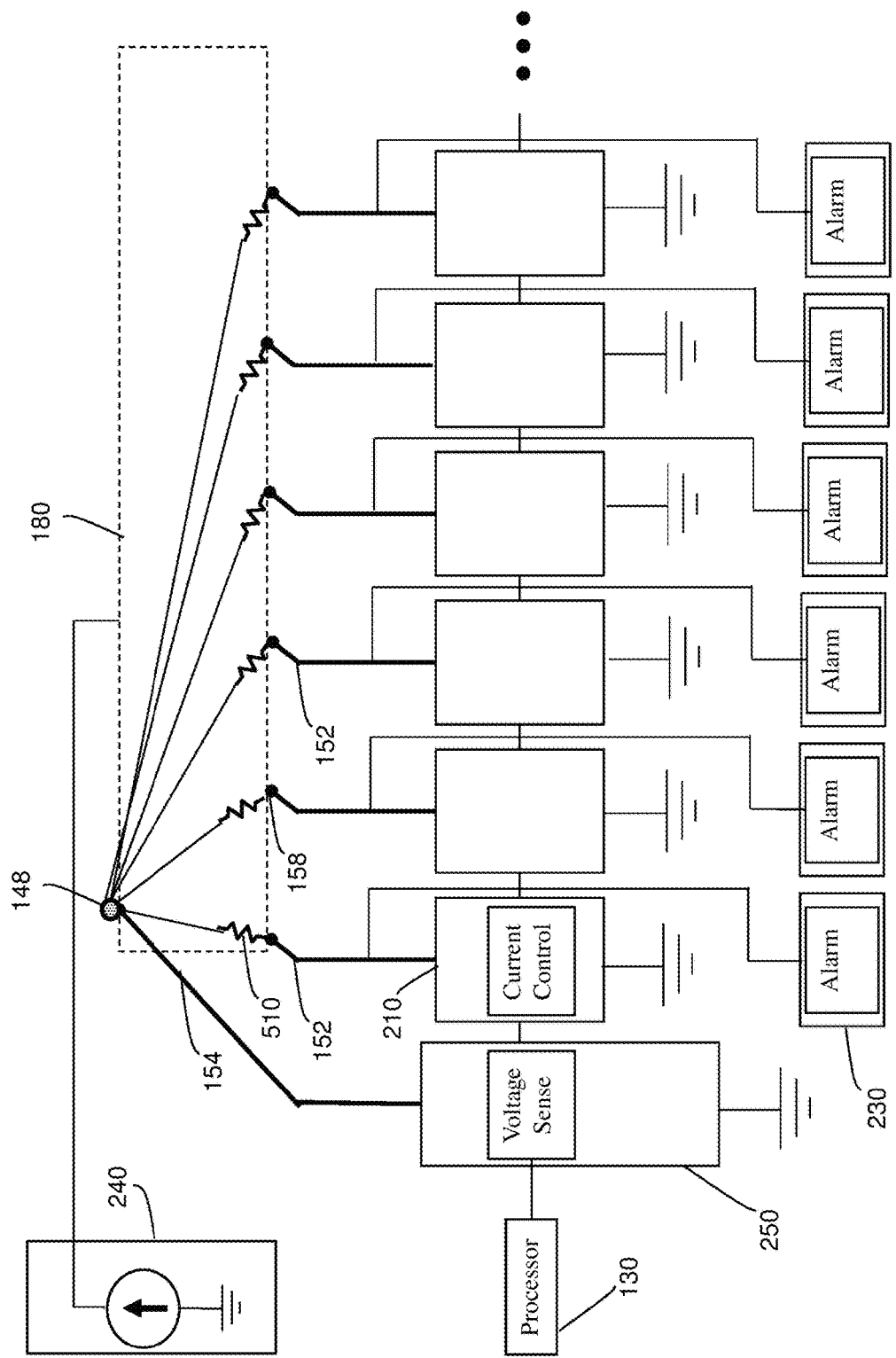
FIG. 5 is a functional block diagram of circuitry for regulating current through a plurality of force needles according to an embodiment of wafer-level testing of a DUT.

FIG. 5 illustrates, schematically, an impact of equi-resistant paths on voltage measurements. FIG. 5 schematically illustrates a sense needle tip 148 and multiple force needles with tips 158. As shown, there is a resistance 510 between each of the force needle tips 158 and the sense needle tip 148. The resistance 510 may represent the distributed resistance through the pad between the force needle and the sense needle. As shown, the resistances 510 are combined at a node, represented by the tip 148 of the sense needle. This configuration creates a resistive voltage averaging circuit such that, if the resistances 510 are equal, the voltage at sense needle tip 148 will be the average of voltages at each of the force needle tips 158.

Thus, making the resistances 510 equal provides a desirable averaging effect. With equal resistances, the measured voltage is an average of the voltage at multiple locations on the source pad. This averaging may tend to average out differences in voltage across the surface of the source pad that may be caused by different current flow through different force needles. Differences in current flow, for example, may result from differences in contact resistance between the force needles and the source pad. Thus, a relative positioning of the force needles and sense needles that provides equi-resistant paths between the force and sense needles tends to reduce the impact of variations in contact resistance on the measured voltage.

FIG. 5 illustrates another approach to reduce the impact of variations in contact resistance on the measured voltage. The approaches disclosed herein may be used separately or together. This alternative approach is based on reducing the variation in current flowing through force needles, even if there are differences in contact resistance. Reduced variation may be achieved by regulating current flow through the force needles.

In embodiments in which the DUT has a uniform ON resistance across the area at which it is contacted by the force needles, the current may be regulated to be equal. In other embodiments, such as in embodiments in which the resistance is different at different locations, the current may be regulated to have some predetermined ratios between current in the force needles. Those proportions may be selected, for example, to generate equal voltage at each location where the force needle contacts the DUT. In scenarios in which the resistance through the DUT is uniform at all locations where force needles contact the DUT, equal voltages may be generated by equal currents. In other embodiments, the current through each needle may be scaled in proportion to the voltage through the DUT at the location where the force needle contacts the DUT. Though, any suitable criteria may be used in selecting a value to which a current is to be regulated.

FIG. 5 illustrates an embodiment in which current regulation is used. The current regulation may generate equal voltages for each of the force needles regardless of contact resistance. Without regulation, a force needle with a high contact resistance might have a lower current flow than a force needle with a low contact resistance. Accordingly, regulation reduces variation that can be caused by variations in contact resistance between the force needles and the DUT.

FIG. 5 illustrates probe needles connected to the circuitry of the tester 110. In the embodiment illustrated, the tester may comprise a current source 240 that generates a programmable amount of current. In the embodiment illustrated, the programmable amount of current may represent a total current to pass through a DUT. Such a current source, for testing a high-current device, may output current in any suitable range, such as 10's of Amps. However, the total current is not a limitation of the invention and any suitable total current may be used.

As shown, current source 240 is coupled to one side of DUT 180, using any of the techniques described herein or any other known technique. The force needles are also coupled to DUT 180 such that a current flowing from current source 240 through DUT 180 may be distributed among the force needles.

In the embodiment illustrated, each of the force needles 152 is coupled to a current control circuit 210. The amount of the current passing through each force needle may therefore be regulated by a control input to the current control circuits 210. In some embodiments, the control input to each may result in equal current flow through each of the force needles such that regulation of current through the force needles results in an equal distribution of the total current from current source 240 among the force needles 152.

Here, the control inputs to all of the current control circuits 210 are the same, representing an embodiment in which the current from current source 240 is distributed equally. However, it should be appreciated that by scaling the control inputs within each current control circuit 210, different values of the control inputs may result in equalizing the currents or the same values of the control inputs may result in unequal currents. Scaling components, such as gains of amplifiers, values of resistive dividers, may be selected to achieve a desired result. In the embodiment illustrated, the control inputs are proportional to the sensed voltage on the pad to which the force needles are coupled with respect to ground or some other reference potential.

The tester may contain voltage sensing circuitry 250, coupled to a sense needle 154 to measure that voltage. The sensed voltage may be used to generate control inputs to the current control circuits 210 as well as to provide a measured parameter that may be used to compute ON resistance. Voltage sensing circuitry 250 may sense the voltage 174 (FIG. 1) between the point where the sense needle 154 makes contact to the source pad 182 and the chuck 170 (FIG. 1) while the DUT 180 is turned on.

The processor 130 may be coupled to receive a measured voltage from the voltage sense circuit 250, representing in the illustrated embodiment, the sensed voltage 174 between the source pad 182 and the chuck 170. This voltage may represent the drain to source voltage of the DUT. Processor 130 may use this value, in combination with a programmed or measured value of the current through current source 240, to compute the ON resistance of DUT 180.

Any suitable voltage sensing circuitry may be used. Likewise, any suitable current source may be used. However, in some embodiments, the voltage source may be sufficiently accurate and the current source may be of sufficiently high current that the test system may measure ON resistance of devices having ON resistances of 1 milliohm and below.

FIG. 5 illustrates 1 sense needle multiple force needles, where each of the force needles is connected to a current control circuitry 210. Any number of force needles may be used, such as 8 force needles. In other embodiments, more than 8 force needles may be used. In some embodiments, there may be more current control circuits than there are force needles used to test a device. In such an embodiment, less than all of the current control units 210 may be activated such that only the force needles in use are controlled. For example, if 4 force needles are needed, only 4 force needles will be actively controlled by the current control units 210. In such an embodiment, the scaling of the sensed voltage signal to generate control inputs for the current control circuits may vary based on the number of force needles used.

FIG. 5 illustrates a further feature that may be incorporated in a test system. The test system may include alarm circuits, associated with each of the force needles that generate an alarm output signal when the contact resistance of a force needle exceeds a threshold. FIG. 5 shows such alarm circuits 230.

In the embodiment illustrated, each of the alarm circuits 230 is coupled to a node of the current control circuit such that it is coupled to a force needle. Therefore, the voltage applied to alarm circuit 230 is proportional to the voltage at the force needle. In an embodiment in which the current through the force needles is regulated, using the basic principle of Ohm's Law ($V=IR$), that voltage is proportional to the regulated current for the force needle and sum of the ON resistance of the device plus the contact resistance for that force needle. Accordingly, an increase in contact resistance increases the voltage at the tip of the force needle.

Alarm circuit 230, by monitoring this voltage, may detect a voltage indicating an undesirably large contact resistance. Such a voltage may be contacted in any suitable way, such as by comparing the detected voltage to a predetermined threshold. Alternatively or additionally, alarm circuit 230 may monitor changes in the measured voltage, indicative of an increase in contact resistance. As yet a further alternative, alarm circuit 230 may output an indication when the voltage detected at one force needle exceeds the average voltage at the other force needles by a threshold amount or percent.

Regardless of how an alarm condition is detected, in response, alarm circuit 230 may output an alarm indication. In the embodiment of FIG. 5, each of the current control circuits 210 is coupled to a separate alarm circuit 230. The outputs of the alarm circuits are connected together in a logical OR fashion, producing one alarm indication for the test site including all of the probes coupled to a DUT. However, the alarm indications maybe combined or processed in any suitable way.

Any suitable response may be made to an alarm indication. In some embodiments, the alarm condition may trigger maintenance of the test system, such as cleaning or replacing the card. In other embodiments, an alarm condition associated with a set of needles aligned as a test site for testing one DUT on a wafer may cause the test system to cease use of the test site, and test the DUT using other needles from another site.

Figure 6:
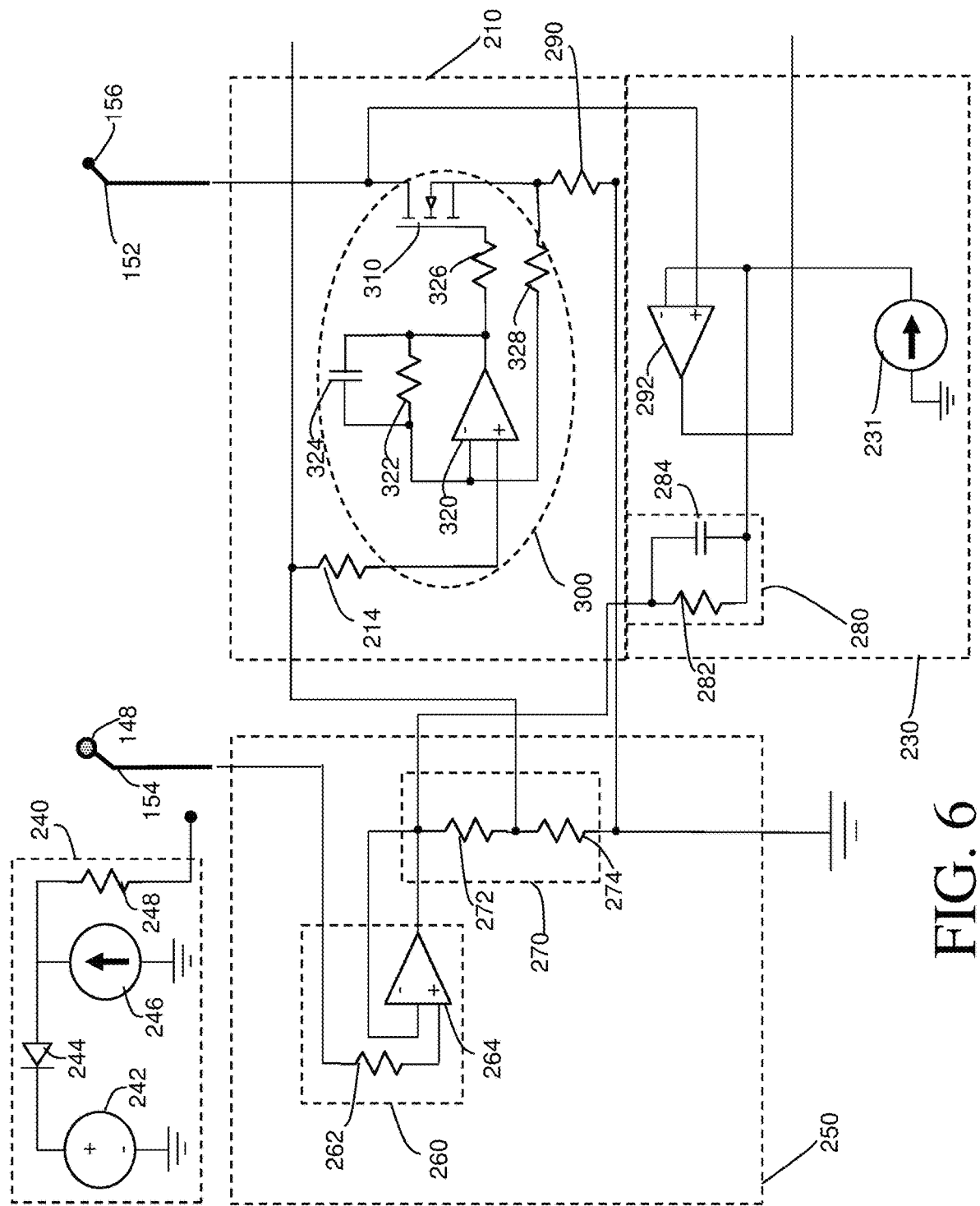
FIG. 6 is a schematic illustration of circuitry for regulating current according to an embodiment of wafer-level testing of a DUT.

FIG. 6 illustrates in more detail an example of circuitry for a voltage sense circuit, a current control circuit and alarm circuit. As illustrated, current source 240 may include components in addition to a current source 246. In this example, current source 240 is shown to include a voltage source 242 coupled to current source 246 through diode 244. Additionally, resistor 240 is coupled to current source 246. These components, such as voltage source 242 and resistor 240, may be physical components or may, in some embodiments, be understood to represent characteristics of current source 240.

The components of current source 240 may be implemented using techniques as are known in the art of test system design. These components may be controlled, such as by processor 130, to generate a total current suitable for parametric testing of a high-current device, such as a power MOSFET. This current may be generated as a current pulse such that it is generated only during a test of a DUT. The magnitude of the generated current may be of any suitable value, such as 10 A, 20 A, 30 A, 40 A, 50 A, 60 A, or 70 A.

An exemplary implementation of voltage sense circuit 250 is also shown in FIG. 6. In this example, a first amplifier 260 is implemented by op-amp 264 configured in a buffering configuration. An input of op-amp 264 is coupled to sense needle 154 through resistor 262. The sensed voltage output from op-amp 264 may be coupled through an A/D converter to processor 130 or otherwise used to capture a representation of the measured voltage that can be used in conducting a test on a DUT. That processing can be done in a conventional way, and is not shown in detail.

In this example, the sensed voltage output from op-amp 264 is also used to both provide a control input for the current control circuits 210 and to provide a reference for alarm circuits 230. The control input to current control circuits 210 is provided by applying the output of op-amp 264 to a resistor divider network 270 performed by resistors 272 and 274. In this embodiment, the ratio of resistors 272 and 274 may be proportional to the number of current control circuits 210 that are active. For example, in embodiments in which eight current control circuits 210 are used, the ratio of resistors may be 8 to 1.

That divided-down sensed voltage is applied as a control input to each of the current control circuits 210. Within the current control circuit, the control input is applied to a comparator circuit, here implemented with op amp 320. Resistor 322 and capacitor 324 are configured to provide a feedback path for op amp 320, configuring op-amp 320 as a comparator. In this configuration, the output of op amp 320 reflects the difference in voltages at its input terminals. In some embodiments, op amp 320 is configured as an analog error amplifier control loop.

The divided-down sensed voltage is applied to one terminal of op-amp 320 through resistor 214. A second terminal of op-amp 320 is coupled to resistor 290 through resistor 328. In this configuration, the divided-down sensed voltage is compared to the voltage across resistor 290. In this way, the divided-down sensed voltage is compared to the voltage across resistor 290.

This example, resistor 290 acts as a current sense resistor. It is coupled to a force needle 152 through transistor 310, such that the current flowing through the force needle also flows through resistor 290. Resistor 290 has a value that approximates the ON resistance of the DUT. If a force needle 152 is supplying resistor 290 a proportionate share of current to the DUT, the voltage across resistor 290 will be equal to the divided-down sensed voltage.

If the force needle 152 coupled to the current control circuit 210 is supplying less than its proportionate share, the voltage across resistor 290 will be less than the divided-down sensed voltage. In this scenario, the output of the comparator circuit formed by op-amp 320 will indicate that the current flow through that force needle should be increased. As shown, the output of op-amp 320 is coupled through resistor 326 to the gate of transistor 310. As the output of the comparator increases, the gate voltage of transistor 310 will increase, thereby increasing the current flow through the force needle.

On the other hand, if the force needle coupled to the current control circuit 210 is supplying more than its proportionate share, the voltage across resistor 290 will be greater than the divided-down sensed voltage. In this scenario, the output of the comparator circuit formed by op-amp 320 will indicate that the current flow through that force needle should be decreased. Because that output is coupled to transistor 310, transistor 310 will decrease the current flow. In this way, the current through each of the force needles may be regulated.

For use in detecting a high contact resistance alarm condition, the output of voltage sense circuit 250 is also coupled to alarm circuits 230. Within alarm circuit 230, that voltage is coupled to a thresholding comparator. That thresholding comparator is also coupled to the force needle. The comparator may be configured to output a signal, indicating an alarm condition, when the voltage at one force needle deviates by more than a threshold amount from the average sensed voltage. In a configuration as is illustrated in FIGS. 2-4, such a difference may be the result of the contact resistance for the force needle. By appropriately selecting a threshold, a difference exceeding the threshold may indicate a problematic contact resistance for the force needle such that generating alarm condition when the threshold is exceeded may indicate a corrective action for the high contact resistance is warranted.

A threshold comparator for the alarm circuit may be implemented using open collector comparator 292. A force current may be used to set an alarm threshold. In this example, the threshold is set by the level of current supplied by current source 231, which is coupled to an input terminal of comparator 292. That divided-down sensed voltage is coupled through filter 280, implemented in the embodiment illustrated with resistor 282 and capacitor 284. These components provide a low-pass filter configuration, reducing the chances of an alarm from a transient condition not indicative of a high contact resistance.

Using an open collector comparator enables the comparators of multiple alarm circuits 230 to be directly connected together. However, this feature is not critical to the invention, and any suitable circuit arrangement may be used.

The values of the specific components illustrated may be selected to provide scaling, or other manipulation, of signals to provide the described control functions. For example, in the embodiment described above, current flow is regulated to be equal in each of the force needles. Different component values may provide for other weighting or scaling.

Figure 7:
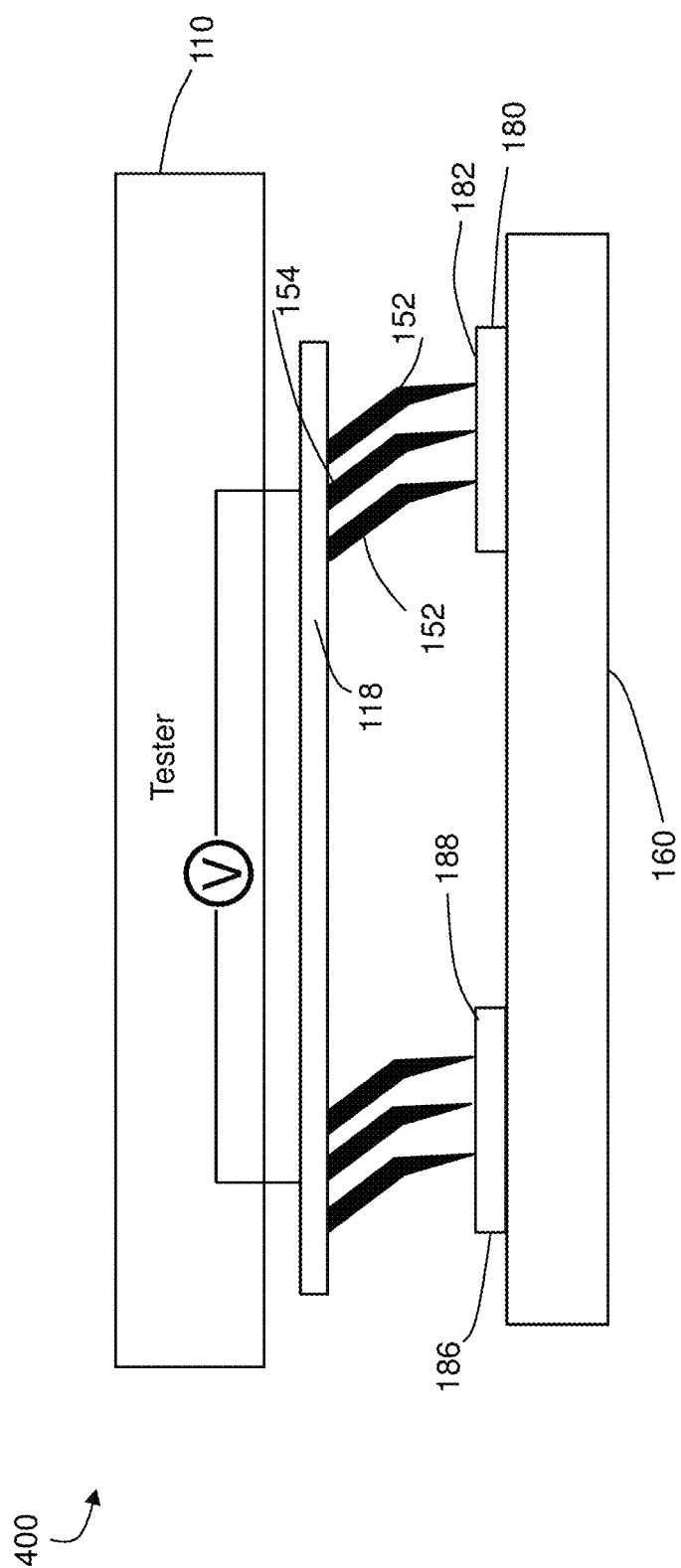
FIG. 7 is a schematic, profile view of a probe card and probe needles contacting a pad of a semiconductor device according to a second embodiment of wafer-level testing of a DUT.

In the embodiment illustrated in FIG. 1, a voltage at a pad of a DUT is referenced to the potential of a chuck on which a wafer containing the DUT is contacting. In other test configurations, other reference points may be used for voltage measurements. FIG. 7 illustrates another embodiment of a test system performing wafer-level parametric measurements. In this embodiment, a voltage measurement at a pad of one DUT may be referenced to a voltage measured at a pad of an adjacent DUT on a wafer. On a wafer in which the DUT's are connected via the wafer substrate, such a test configuration may enable a voltage across a vertical device to be measured with contact on the upper surface of the wafer.

In the example of FIG. 7, devices on the wafer are or include vertical power MOSFETs. In such an embodiment, the drains of the power MOSFETs may be connected together through the wafer substrate. By turning on one or more of the power MOSFETs near the DUT, there will be a low resistance path between the drain of the power MOSFET under test and the source pads of the nearby power MOSFETs that are turned on. The current flow through the nearby power MOSFETs may be negligible. In this scenario, the voltage on the source pads may be a suitable approximation of the drain voltage at the DUT. Thus, the drain to source voltage of the DUT can be measured by probing at the source pad of the DUT and one or more nearby power MOSFETs on the wafer that are turned on, but not otherwise driven by a source of voltage or current.

FIG. 7 illustrates a test system 400 using adjacent DUTs as part of the wafer-level parametric testing process. For example, an adjacent device 186 may be biased on to provide a connection to the common drain between device 186 and DUT 180 via wafer 160. The source pad 188 of device 186 may be connected via one or more sense needles to a reference terminal of a voltage measurement circuit. The tester 110 may then make a voltage measurement between pad 188, which is connected to the common drain, and the sense needle 154 contacting the DUT. Such measurements may be made with force and sense needles distributed in accordance with any of the embodiments described herein, or in any other suitable way.

Having thus described embodiments of a test system and test methods, it will be appreciated that alternative implementations and embodiments are possible. For example, techniques are described above to make a high-quality connection that reduces voltage measurement errors. In some embodiments, the voltage errors may be reduced to less than 100 µV. However, greater or lower measurement accuracy may be achieved in other embodiments.

Also, probe needles as described herein may be straight, with pointed tips. However, other configurations are possible As used herein, the term "needle" means a structure adapted to make contact with a test point on a semiconductor die. The "needle" may be long and straight with a pointed tip. However, other types of contract structures are known and may be regarded as probe needles. For example, compliant structures that have twists or bends may be used. In other embodiments, contacts may be in the shape of bumps or spring probes. Also, multiple conductors may be used to make contact.

Also, various parameters are said to be "equal." It should be appreciated that exact numerical identity is not required and that tolerance for deviation from exact equality will be acceptable, and that values within such a tolerance are "equal" as that term is used herein. As used herein, "equi-distant" means approximately equal. For example, a distance between a first point where a first probe needle contacts a test pad and a second point where a second needle contacts the pad is equal to another distance between a third point where a third probe needle contacts a test pad and the first point. However, exact equality is not required. Rather, in some embodiments, equi-distant objects may be spaced apart by differences that differ within some tolerance. The amount of tolerance may depend on the application or the manufacturing techniques used to make the objects. In some embodiments, values may be equalized to regulate within +/−20%. However, in other embodiments, the tolerance may be tighter, such as +/−10% or +/−5% or +/−1% or +/−0.5%.

As used herein, "equi-resistant" means approximately equal. For example, a resistance between a first point where a first probe needle contacts a test pad and a second point where a second needle contacts the pad is equal to another resistance between a third point where a third probe needle contacts a test pad and the first point. However, exact equality is not required. Rather, in some embodiments, equi-resistant objects may be spaced apart on a material that is associated with a particular resistance such that the resistance measured from a reference point on the material to any equi-resistant object is approximately the same. The resistance values will be approximately equal, but may differ within some tolerance. The amount of tolerance may depend on the application. In some embodiments, values may be equalized to regulate within +/−20%. However, in other embodiments, the tolerance may be tighter, such as +/−10% or +/−5% or +/−1% or +/−0.5%. The above definition applies to any and all forms of the term "equi-resistant," such as "equi-resistance".

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Use of ordinal terms such as "first," "second," "third," etc., in the claims to modify a claim element does not by itself connote any priority, precedence, or order of one claim element over another or the temporal order in which acts of a method are performed. Such terms are used merely as labels to distinguish one claim element having a certain name from another element having a same name (but for use of the ordinal term).

The phraseology and terminology used herein is for the purpose of description and should not be regarded as limiting. The use of "including," "comprising," "having," "containing", "involving", and variations thereof, is meant to encompass the items listed thereafter and additional items.

Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A method of testing a semiconductor device on a wafer, the method comprising:
   holding the wafer with a chuck;
   contacting a first pad of the semiconductor device with a plurality of probe needles, the plurality of probe needles comprising a plurality of first needles and at least one second needle, and the plurality of probe needles comprising tips, wherein the tips of the plurality of first needles are positioned so as to provide equi-resistant paths between tips of the first needles to a nearest tip of a probe needle of the at least one second needle;
   providing current through the plurality of first needles; and measuring voltage at the at least one second needle, wherein:
   providing current comprises inducing a current between the first needles and the chuck along a current path through the chuck, the semiconductor device, the first pad, and tips of the plurality of first needles that are in contact with the first pad, in such order.

2. The method of claim 1, further comprising:
   computing an ON resistance of the semiconductor device based on the measured voltage.

3. A method of manufacturing a semiconductor device incorporating the method of testing of claim 2 further comprising: selecting at least one subsequent step in the manufacturing based on the computed ON resistance.

4. The method of claim 2, wherein:
   the method of claim 2, wherein the ON resistance is less than 1 milliOhm.

5. The method of claim 1, wherein:
   the semiconductor device is a power FET.

6. The method of claim 4, wherein:
   providing current comprises sourcing current through each of the plurality of first needles in the range of 0 Amps to 7 Amps.

7. The method of claim 1, wherein:
   the at least one second needle comprises a single needle.

8. The method of claim 1, wherein:
   the tips of the plurality of first needles are disposed equi-distant from the tips of the at least one second needle.

9. The method of claim 1, wherein:
   the at least one second needle comprises a plurality of second needles; and
   a tip of each of the plurality of second needles is positioned adjacent a tip of the plurality of first needles.

10. The method of claim 9, wherein:
    measuring voltage comprising measuring a composite voltage at a first node to which the plurality of second needles are connected.

11. The method of claim 9, wherein:
    measuring voltage comprising measuring a composite voltage at a first node to which the plurality of second needles are coupled through equal-valued resistors.

12. The method of claim 1, wherein:
    measuring voltage comprises measuring a voltage difference between the chuck and the at least one second needle.

13. The method of claim 1, wherein:
    the semiconductor device is a first semiconductor device on a wafer;
    the wafer comprises at least one second semiconductor device adjacent the first semiconductor device, each of the at least one second semiconductor device comprising a second pad;

measuring voltage comprises:
biasing on the at least one second semiconductor device; and
connecting the second pad of the at least one second semiconductor device to a second node; and
measuring a voltage difference between the second node and the at least one second needle.

14. A probe card for testing a semiconductor device on a wafer, the semiconductor device comprising a MOSFET with a pad, the probe card comprising:
a plurality of needles comprising tips positioned to contact the pad, the plurality of needles comprising a plurality of force needles and at least one sense needle;
wherein the plurality of force needles are positioned with tips that are equi-distant from a nearest tip of a sense needle of the at least one sense needle, wherein the wafer is held by a chuck, and wherein
the probe card is part of a test system comprising the chuck, the testing system configured to provide a current between the plurality of force needles and the chuck along a current path through the chuck, the semiconductor device, the pad, and tips of the plurality of force needles that are in contact with the pad, in such order.

15. The probe card of claim 14, wherein:
the tips of the plurality of force needles are positioned along an arc of a circle around a tip of one sense needle.

16. The probe card of claim 15, wherein:
the at least one sense needle comprises a plurality of sense needles; and
a tip of each of the plurality of sense needles is positioned adjacent a tip of the plurality of force needles.

17. A test system for testing a semiconductor device on a wafer, the semiconductor device comprising a pad, the test system comprising:
a chuck positioned to receive the wafer;
a probe card comprising:
a plurality of needles comprising tips positioned to contact the pad, the plurality of needles comprising a plurality of first needles and at least one second needle;
wherein the plurality of first needles are positioned with tips that are equi-distant from a nearest tip of a needle of the at least one second needle;
at least one current source coupled to the plurality of first needles and the chuck, the at least one current source configured to induce a current along a current path through the chuck, the semiconductor device, the pad, and tips of the plurality of first needles that are in contact with the pad, in such order; and
at least one voltage sense circuit coupled to the at least one second needle.

18. The test system of claim 17, further comprising:
a processor coupled to receive a value indicative of voltage sensed by the at least one voltage sense circuit and to compute, based on the voltage sensed, an ON resistance of the semiconductor device, wherein the voltage is sensed between the pad and the chuck.

19. The test system of claim 17, wherein the chuck comprises a surface for receiving the wafer and the surface comprises gold plating.

20. The test system of claim 17, wherein the at least one current source is configured to generate a current in excess of 10 Amps.

21. The test system of claim 17, wherein:
the first plurality of needles comprise force needles and the at least one second needle comprises a sense needle.

22. The test system of claim 17, wherein:
the at least one second needle comprises a plurality of second needles; and
the plurality of second needles are connected to a single voltage sense circuit of the at least one voltage sense circuit.

23. The test system of claim 22, wherein:
the plurality of second needles are connected to the single voltage sense circuit through equal-valued resistors.

24. The test system of claim 17, wherein:
the chuck comprises a surface for receiving the wafer, and wherein at least a portion of the surface is exposed from the wafer.

25. The test system of claim 17, wherein:
the chuck comprises a surface for receiving the wafer, and wherein the surface is a conductive surface.

* * * * *